(12) United States Patent
Kim

(10) Patent No.: US 9,054,340 B2
(45) Date of Patent: Jun. 9, 2015

(54) FLEXIBLE DISPLAY DEVICE AND MANUFACTURING METHOD OF THE SAME

(71) Applicant: Samsung Display Co., Ltd., Yongin, Gyeonggi-do (KR)

(72) Inventor: Hyun-Chel Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 22 days.

(21) Appl. No.: 13/834,464

(22) Filed: Mar. 15, 2013

(65) Prior Publication Data

US 2014/0131668 A1   May 15, 2014

(30) Foreign Application Priority Data

Nov. 12, 2012 (KR) .......... 10-2012-0127506

(51) Int. Cl.
*H01L 51/52* (2006.01)
*H01L 51/56* (2006.01)
*H01L 27/32* (2006.01)

(52) U.S. Cl.
CPC ............ *H01L 51/56* (2013.01); *H01L 51/5237* (2013.01); *H01L 51/5253* (2013.01); *H01L 51/5256* (2013.01); *H01L 27/3244* (2013.01); *H01L 2227/326* (2013.01); *H01L 2251/5338* (2013.01)

(58) Field of Classification Search
CPC .......................... H01L 51/56; H01L 51/5237
See application file for complete search history.

(56) References Cited

U.S. PATENT DOCUMENTS

| 2011/0139747 A1* | 6/2011 | Lee ................................ 216/37 |
| 2011/0193067 A1* | 8/2011 | Lee et al. ........................ 257/40 |
| 2012/0037993 A1* | 2/2012 | Yamazaki et al. ............ 257/347 |

FOREIGN PATENT DOCUMENTS

| JP | 2004-118151 | 4/2004 |
| KR | 10-2009-0102065 | 9/2009 |
| KR | 10-2010-0027108 | 3/2010 |
| KR | 10-2011-0101518 | 9/2011 |

* cited by examiner

*Primary Examiner* — William F Kraig
*Assistant Examiner* — Valerie N Newton
(74) *Attorney, Agent, or Firm* — Knobbe Martens Olson & Bear LLP

(57) ABSTRACT

A flexible display device includes: a display panel including a display substrate, an organic light emitting element formed on the display substrate, and a thin film encapsulation layer covering the organic light emitting element; a first insulation layer formed under the display panel; a lower protection film formed under the first insulation layer; and a reinforcement layer formed under the lower protection film, between the lower protection film and the first insulation layer, or on the display panel, wherein the reinforcement layer is configured to prevent damage to the display panel due to bending stress.

12 Claims, 8 Drawing Sheets

FLEXIBLE DISPLAY DEVICE AND MANUFACTURING METHOD OF THE SAME

CROSS-REFERENCE TO RELATED APPLICATIONS

This application claims priority to, and the benefit of, Korean Patent Application No. 10-2012-0127506 filed in the Korean Intellectual Property Office on Nov. 12, 2012, the entire contents of which are incorporated herein by reference.

BACKGROUND

1. Field

The present disclosure relates to a flexible display device and a manufacturing method thereof.

2. Description of the Related Technology

In recent years, flexible displays having a lightweight and a shock-resistant flexible substrate made of a material such as plastic have been developed. Such a flexible display can be maximized in portability since it can be folded or rolled up, and can be applied in various fields.

A flexible display includes a display element formed on a flexible substrate. Display elements that can be used for a flexible display include an organic light emitting diode display (OLED) device, a liquid crystal display (LCD) device, and an electrophoretic display (EPD) device.

These display elements commonly include thin film transistors. Thus, in order to form a flexible display, the flexible substrate undergoes a number of thin film processes.

Also, the flexible substrate is encapsulated through a thin film process by an encapsulation substrate. The flexible substrate, the thin film transistor formed on the flexible substrate, and the encapsulation substrate form a display panel of the flexible display device.

However, when the flexible display device is bent, rolled, and folded, the display panel receives bending stress in the display device. At this time, if bending stress of more than a predetermined degree is applied to the display panel, damage such as a crack is generated in the thin film transistor or the light emitting element in the display panel.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

Embodiments of the present invention provide a flexible display device in which damage to a display panel due to bending stress is prevented.

Further, embodiments of the present invention provide a manufacturing method of a flexible display device in which damage to a display panel due to bending stress is prevented.

A flexible display device according to an embodiment of the present invention includes: a display panel including a display substrate, an organic light emitting element formed on the display substrate, and a thin film encapsulation layer covering the organic light emitting element; a first insulation layer formed under the display panel; a lower protection film formed under the first insulation layer; and a reinforcement layer formed under the lower protection film, between the lower protection film and the first insulation layer, or on the display panel, wherein the reinforcement layer is configured to prevent damage to the display panel due to bending stress.

The reinforcement layer may be made of an oxide semiconductor.

The reinforcement layer may be made of an oxide semiconductor and a metal.

The metal may be one of copper, ITO, and aluminum.

The oxide semiconductor may be made of at least one of an oxide based on zinc, gallium, tin, or indium, or as a complex oxide thereof, including zinc oxide, indium-gallium-zinc oxide, indium-zinc oxide, or zinc-tin oxide.

The reinforcement layer may include a plurality of layers.

The reinforcement layer may be formed on the display panel, and the device may further include a second insulation layer formed between the display panel and the reinforcement layer.

A manufacturing method of a flexible display device according to an embodiment of the present invention includes: forming a first insulation layer on a supporting substrate; forming a display panel including a display substrate positioned on the first insulation layer, an organic light emitting element formed on the display substrate, and a thin film encapsulation layer covering the organic light emitting element; separating the supporting substrate from the first insulation layer; forming a reinforcement layer on or under the lower protection film positioned under the display panel; and adhering the lower protection film under the first insulation layer, wherein the reinforcement layer is configured to prevent damage to the display panel due to bending stress.

The reinforcement layer may be made of an oxide semiconductor.

The oxide semiconductor may be made of one of an oxide based on zinc, gallium, tin, or indium, or as a complex oxide thereof, including zinc oxide, indium-gallium-zinc oxide, indium-zinc oxide, or zinc-tin oxide.

A manufacturing method of a flexible display device according to another embodiment of the present invention includes: forming a first insulation layer on a supporting substrate; forming a display panel including a display substrate positioned on the first insulation layer, an organic light emitting element formed on the display substrate, and a thin film encapsulation layer covering the organic light emitting element; forming a second insulation layer on the display panel; forming a reinforcement layer on the second insulation layer; separating the supporting substrate from the display panel; and adhering a lower protection film under the display panel, wherein the reinforcement layer prevents damage to the display panel due to bending stress.

The reinforcement layer may be made of an oxide semiconductor.

The oxide semiconductor may be made of one of an oxide based on zinc, gallium, tin, or indium, or as a complex oxide thereof, including zinc oxide, indium-gallium-zinc oxide, indium-zinc oxide, or zinc-tin oxide.

According to the flexible display device according to an embodiment of the present invention, when bending occurs in the display device, damage to the display panel by bending stress may be prevented.

According to the manufacturing method of the flexible display device according to another embodiment of the present invention, a flexible display device that prevents damage to the display panel due to bending stress may be manufactured.

DETAILED DESCRIPTION OF CERTAIN INVENTIVE EMBODIMENTS

Figure 1:
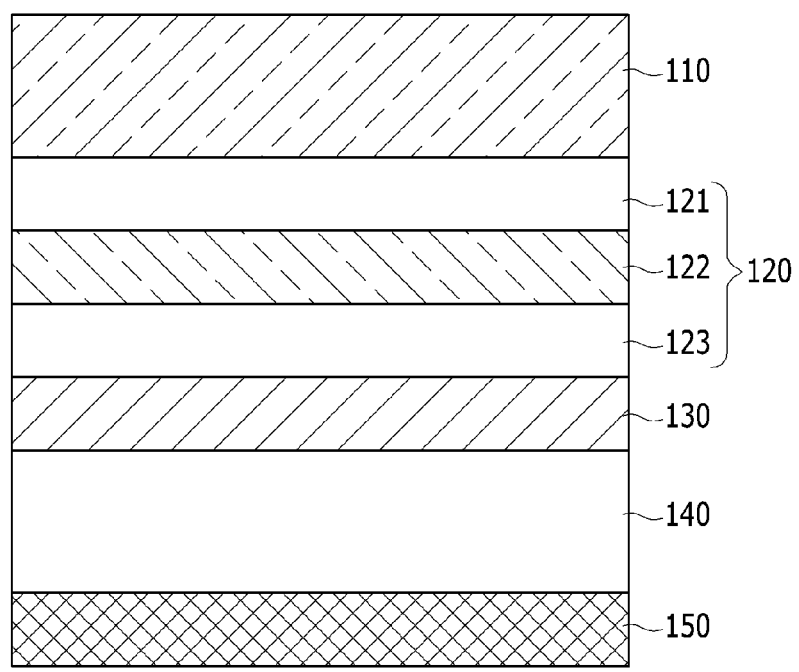
FIG. 1 is a cross-sectional view of a flexible display device according to one embodiment of the present invention.

The present invention will be described more fully hereinafter with reference to the accompanying drawings, in which certain embodiments of the invention are shown. As those skilled in the art would realize, the described embodiments may be modified in various ways, without departing from the spirit or scope of the present invention. The drawings and description are to be regarded as illustrative in nature and not restrictive. Like reference numerals generally designate like elements throughout the specification.

In addition, the size and thickness of each element in the drawings are illustrated for better understanding and ease of description, and the present invention is not limited thereto.

In the drawings, the thickness of layers, films, panels, regions, etc., may be exaggerated for clarity. In the drawings, for better understanding and ease of description, thicknesses of some layers and areas may be excessively displayed. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

FIG. 1 is a cross-sectional view of a flexible display device according to an embodiment of the present invention.

Referring to FIG. 1, a flexible display device according to an embodiment includes a display panel 120, a polarizing plate 110, a first insulation layer 130, a lower protection film 140, and a reinforcement layer 150.

According to the first embodiment of the present invention, the display panel 120 is a constituent element displaying an image. The display panel 120 that is described below is a display panel 120 for an organic light emitting diode (OLED) display including an organic light emitting element, however it is not limited thereto, and the display panel may be a display panel for a liquid crystal display (LCD), a plasma display device (PDP), an electric field effect display device (FED), an electrophoretic display device, or the like.

Referring to FIG. 1, the display panel 120 is generally divided into a display substrate 123, an organic light emitting element 122, and a thin film encapsulation layer 121. The detailed descriptions thereof will be given with reference to FIG. 2 and FIG. 3.

Figure 2:
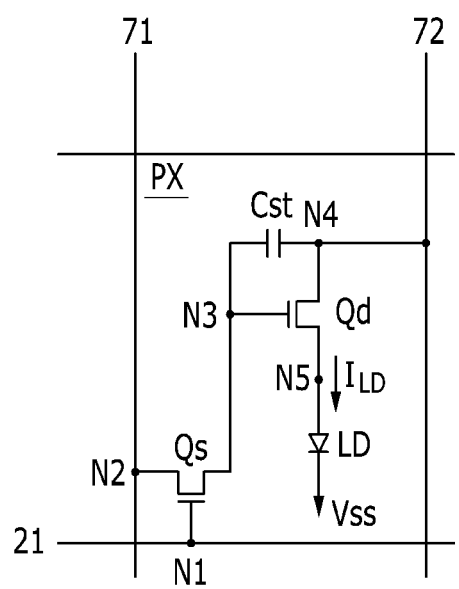
FIG. 2 is an equivalent circuit of one pixel of the display panel shown in FIG. 1.
Figure 3:
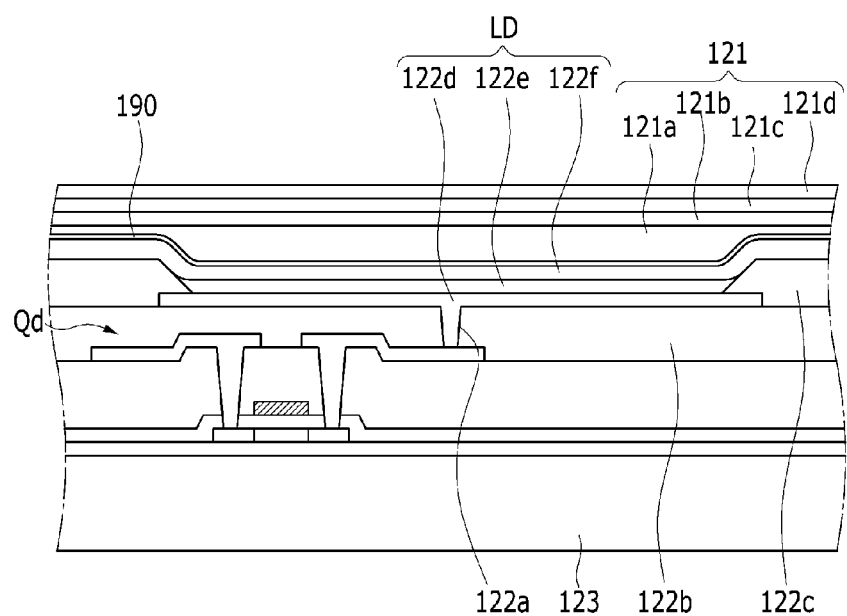
FIG. 3 is a cross-sectional view of the display panel shown in FIG. 1.

FIG. 2 is an equivalent circuit of one pixel of the display panel shown in FIG. 1, and FIG. 3 is a cross-sectional view of the display panel shown in FIG. 1.

Referring to FIG. 2, the display panel 120 includes a plurality of signal lines 21, 71, and 72 and a pixel PX connected thereto. The pixel PX may be one of a red pixel (R), a green pixel (G), or a blue pixel (B).

The signal lines include scanning signal lines 21 for transmitting gate signals (or scanning signals), data lines 71 for transmitting data signals, and driving voltage lines 72 for transmitting a driving voltage. The scanning signal lines 21 extend substantially in a row direction and substantially parallel to each other, and the data lines 71 extend substantially in a column direction and substantially parallel to each other. The driving voltage lines 72 extend substantially in a column direction and substantially parallel to each other, however they may extend in the row direction or the column direction, and may form a mesh shape.

One pixel PX includes a switching transistor Qs, a driving transistor Qd, a storage capacitor Cst, and an organic light emitting element LD.

The switching transistor Qs has a control terminal N1, an input terminal N2, and an output terminal N3. The control terminal N1 is connected to the scan signal line 21, the input terminal N2 is connected to the data line 71, and the output terminal N3 is connected to the driving transistor Qd. The switching transistor Qs transmits data signals applied to the data line 71 to the driving transistor Qd in response to a gate signal applied to the gate line 21.

The driving transistor Qd also includes the control terminal N3, the input terminal N4, and the output terminal N5. The control terminal N3 is connected to the switching transistor Qs, the input terminal N4 is connected to the driving voltage line 72, and the output terminal N5 is connected to the organic light emitting element LD. The driving transistor Qd drives an output current $I_{LD}$ having a magnitude depending on the voltage between the control terminal N3 and the output terminal N5 thereof.

The capacitor Cst is connected between the control terminal N3 and the input terminal N4 of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal N5 of the driving transistor Qd and a cathode connected to a common voltage Vss. The organic light emitting element LD emits light having an intensity depending on an output current $I_{LD}$ of the driving transistor Qd, thereby displaying images. The organic light emitting element LD may include an organic material uniquely emitting at least one of three primary colors of red, green, and blue, and the organic light emitting device displays desired images by a spatial sum thereof.

Next, referring to FIG. 3, a cross-section of the display panel 120 will be described. The cross-section of the display panel 120 of FIG. 3 shows the display panel 120 of FIG. 1 in detail.

Referring to FIG. 3, a driving transistor Qd is formed on a display substrate 123 made of transparent glass or plastic. Also, a plurality of signal lines (not shown) and a plurality of switching transistors (not shown) may be further formed on the display substrate 123. According to the one embodiment of the present invention, the display substrate 123 may be a flexible substrate.

A protective layer 122b made of an inorganic material or an organic material is formed on the driving transistors Qd. When the protective layer 122b is made of the organic material, the surface thereof may be flat. The protective layer 122b has a contact hole 122a exposing a portion of the driving transistor Qd. A pixel electrode 122*d* is formed on the protective layer 122*b*. The pixel electrode 122*d* may include a reflective electrode and a transparent electrode formed thereon. The reflective electrode may be made of a metal having high reflectance, such as silver (Ag) or aluminum (Al), an alloy thereof, or the like, and the transparent electrode may be made of a transparent conductive oxide such as ITO (indium tin oxide) or IZO (indium zinc oxide).

A pixel definition layer 122*c* covering a circumference of an edge of the pixel electrode 122*d* is formed on the protective layer 122*b*.

An organic emission layer 122*e* is formed on the pixel electrode 122*d*, and a common electrode 122*f* is formed on the organic emission layer 122*e* and the pixel definition layer 122*c*.

The organic emission layer 122*e* may further include organic layers (not shown) for efficiently transferring carriers of holes or electrons to the emission layer in addition to an emission layer (not shown) emitting light. The organic layers may be a hole injection layer (HIL) and a hole transport layer (HTL) positioned between the pixel electrode 122*d* and the emission layer 122*e*, and an electron injection layer (EIL) and an electron transport layer (ETL) positioned between the common electrode 122*f* and the emission layer 122*e*.

A cover layer 190 covering the common electrode 122*f* to protect the common electrode 122*f* may be formed of the organic layer on the common electrode 122*f*.

The thin film encapsulation layer 121 is formed on the cover layer 190. The thin film encapsulation layer 121 seals and protects the organic light emitting element LD and a driving circuit portion formed on the substrate 123 from the outside.

The thin film encapsulation layer 121 includes organic encapsulation layers 121*a* and 121*c* and inorganic encapsulation layers 121*b* and 121*d* alternately laminated one by one. FIG. 3 shows a case where the two organic encapsulation layers 121*a* and 121*c* and the two inorganic encapsulation layers 121*b* and 121*d* are alternately laminated one by one to constitute the thin film encapsulation layer 121 as an example, but is not limited thereto.

Referring to FIG. 1, the polarizing plate 110 is disposed on the display panel 120. The polarizing plate 110 converts a light axis of the light emitted through the display panel 120 to the outside. In general, the polarizing plate has a structure in which a transparent protection film is deposited on both sides or one side of a polarizer made of a polyvinyl alcohol-based resin.

In detail, the polarizing plate 110 has a structure in which polyvinyl alcohol-based (PVA) molecule chains are arranged in a predetermined direction, and a triacetyl cellulose (TAC) film as the protection film is adhered to the polarizer including an iodine-based compound or a dichroic polarizer material. At this time, the polarizer and the protection film are adhered by an aqueous adhesive made of a polyvinyl alcohol-based solution.

However, the polarizing plate 110 is not limited thereto, and a polarizing plate of various structures may be used.

The first insulation layer 130 may be formed under the display panel 120. The first insulation layer 130 is positioned between the display panel 120 and a supporting substrate 160 (described below), thereby allowing easy removal of the supporting substrate 160 after depositing the display panel 120.

The first insulation layer 130 may be a polyimide, an acryl, a benzocyclobutene, or an epoxy. However, the first insulation layer 130 is not limited thereto, and it may be made of various materials having an insulation property.

Referring to FIG. 1, the lower protection film 140 is attached under the first insulation layer 130. The lower protection film 140 is positioned under the display panel 120 thereby having a function of protecting the display panel 120. An adhesion of the lower protection film 140 is described below.

The lower protection film 140 may include a carrier film (not shown) and an adhesive layer (not shown).

The carrier film may include one material selected from polyethylene terephthalate (PET), polyethylene naphthalate (PEN), polyethylene sulfide (PES), polyethylene (PE), urethane, and polycarbonate.

A thickness of the carrier film may be in a range of about 25 μm to about 300 μm. When the thickness of the carrier film is less than about 25 μm, the carrier film is excessively thin such that the function of the lower protection film protecting the lower portion of the organic light emitting display is difficult, while when the thickness of the carrier film is larger than about 300 μm, it is difficult for the organic light emitting device to be flexible when the lower protection film for the display device is attached to the organic light emitting display.

The lower protection film 140 is permanently adhered to the display substrate such that the carrier film of the lower protection film 140 is adhered under the display panel 120 by the adhesive layer.

The adhesive layer has a strong adhesive force. The lower protection film 140 may be an acryl-based strong adhesive film.

In a condition in which the lower protection film 140 is bent, by improving repulsion resistance of the adhesive layer, the display substrate 123 of the display panel 120 and the lower protection film 140 are not separated.

According to an embodiment of the present invention, the reinforcement layer 150 may be formed under the lower protection film 140. When the display device is bent, the reinforcement layer 150 prevents the display panel 120 from being damaged by bending stress.

However, the reinforcement layer 150 is not limited thereto, and it may be formed between the lower protection film 140 and the first insulation layer 130, or on the display panel 120.

The bending may be generated in the flexible display device as the display device having flexibility, and in this case, the display panel 120 in the display device is affected by the bending stress.

In this case, if the display panel 120 is applied with bending stress of more than a predetermined degree, a crack may be generated in the driving transistor Qd or the organic light emitting element inside the display panel 120. That is, the display panel 120 may be damaged, thereby causing an operation error of the display device.

Accordingly, to prevent damage to the display panel 120 due to the bending stress, an additional layer such as the reinforcement layer 150 is added under the display panel 120 such that the bending stress of the display panel 120 may be reduced.

The bending stress is a tension stress and a compression stress that are generated in the display device when a bending moment is applied to the display device. As described above, when the bending moment is applied to the display device, if the physical layer is additionally formed in the display device, the tension stress and the compression stress are reduced.

That is, if the reinforcement layer 150 is additionally formed under or on the display panel 120, the bending stress generated in the display panel 120 is reduced.

Figure 4:
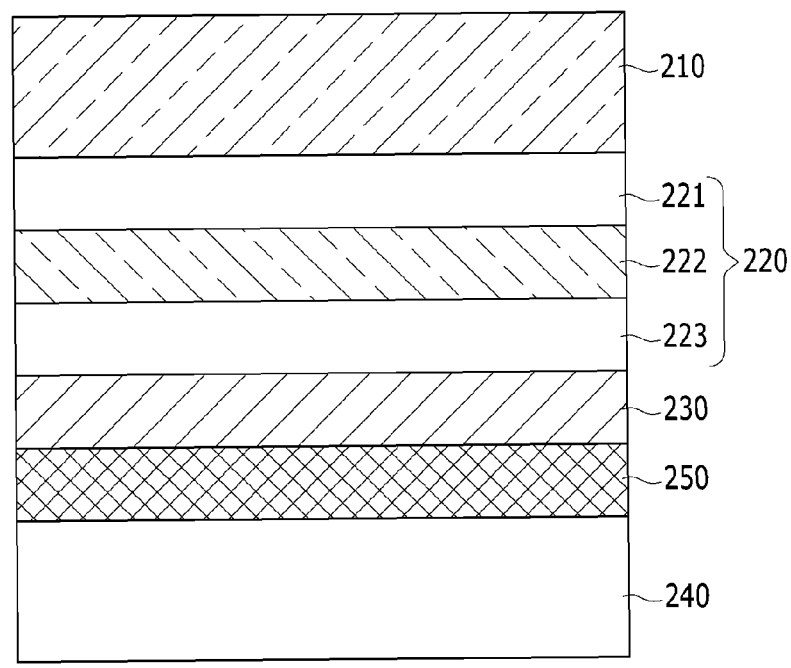
FIG. 4 is a cross-sectional view of a flexible display device according to another embodiment of the present invention.
Figure 5:
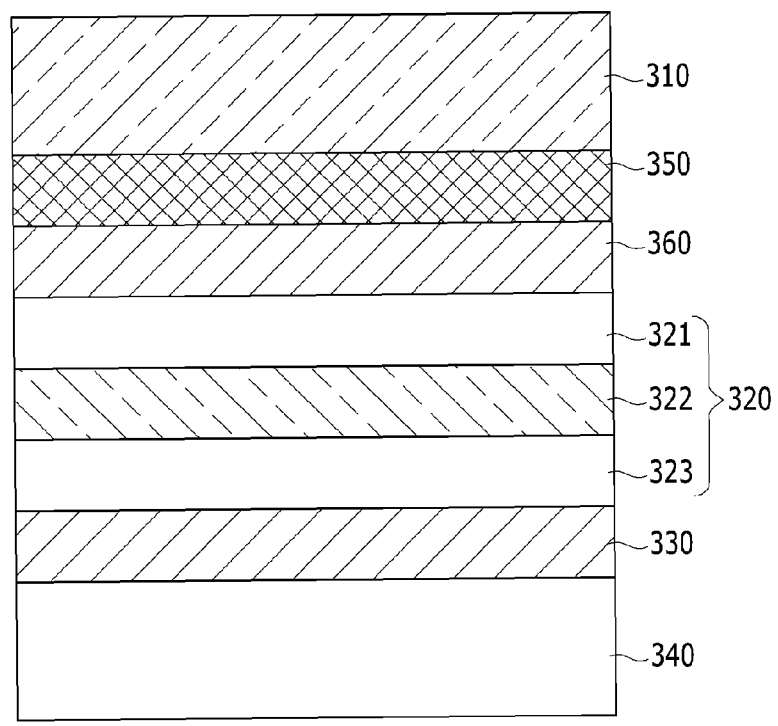
FIG. 5 is a cross-sectional view of a flexible display device according to another embodiment of the present invention.

FIG. 4 is a cross-sectional view of a flexible display device according to another embodiment of the present invention, and FIG. 5 is a cross-sectional view of a flexible display device according to yet another embodiment of the present invention.

Referring to FIG. 4, in the flexible display device according to one embodiment of the present invention, a reinforcement layer 250 may be formed between a first insulation layer 230 and a lower protection film 240.

Referring to FIG. 5, in the flexible display device according to another embodiment of the present invention, a reinforcement layer 350 is formed on a display panel 320. The reinforcement layer 350 may be formed on the display panel 320, that is, on the thin film encapsulation layer 321.

The reinforcement layer 350 may alternatively be formed on a second insulation layer 360 formed in the display panel 320.

When the reinforcement layer 350 is directly formed on a thin film encapsulation layer 321, in the process of forming the reinforcement layer 350 made of an oxide semiconductor, the thin film encapsulation layer 321 may be influenced such that the second insulation layer 360 may be additionally formed between the reinforcement layer 350 and the thin film encapsulation layer 321.

The second insulation layer 360 may be formed with the same material as the first insulation layers 130, 230, and 330.

The reinforcement layers 150, 250, and 350 may be made of polysilicon or the oxide semiconductor.

The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), or as a composite oxide thereof, including one of zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O).

The reinforcement layers 150, 250, and 350 may be made of a composite material including the oxide semiconductor and the metal. The metal may include one of copper, ITO, and aluminum.

The reinforcement layers 150, 250, and 350 may be made of a plurality of layers. The reinforcement layers 150, 250, and 350 may be made of a first reinforcement layer and a second reinforcement layer.

The first and second reinforcement layers may be formed with the same material or with different materials. For example, the first and second reinforcement layers may be made of the oxide semiconductor, or may be made of the composite material including the oxide semiconductor and the metal.

Also, the first and second reinforcement layers may be formed of different materials, that is, one may be made of the oxide semiconductor, and the other may be made of the composite material of the metal or the oxide semiconductor and metal.

Next, a manufacturing method of a flexible display device according to an embodiment of the present invention will be described with reference to FIG. 6 to FIG. 8.

Figure 6:
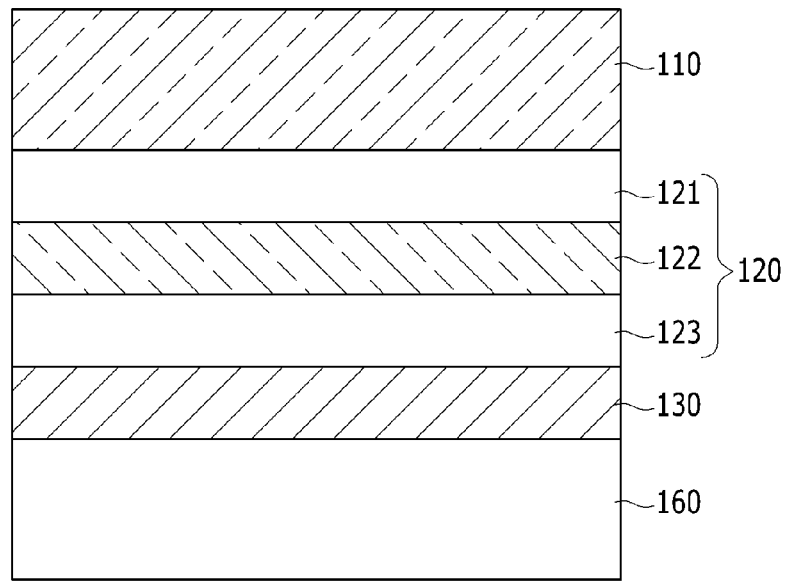
FIG. 6 to FIG. 8 are views sequentially showing a manufacturing method of a flexible display device according to an embodiment of the present invention.
Figure 7:
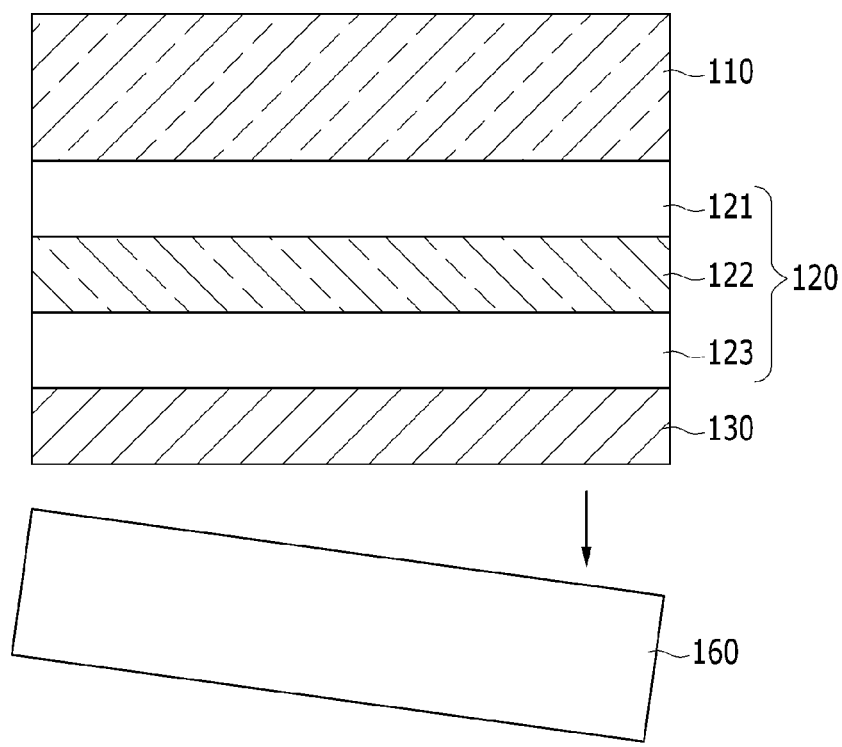
Figure 8:
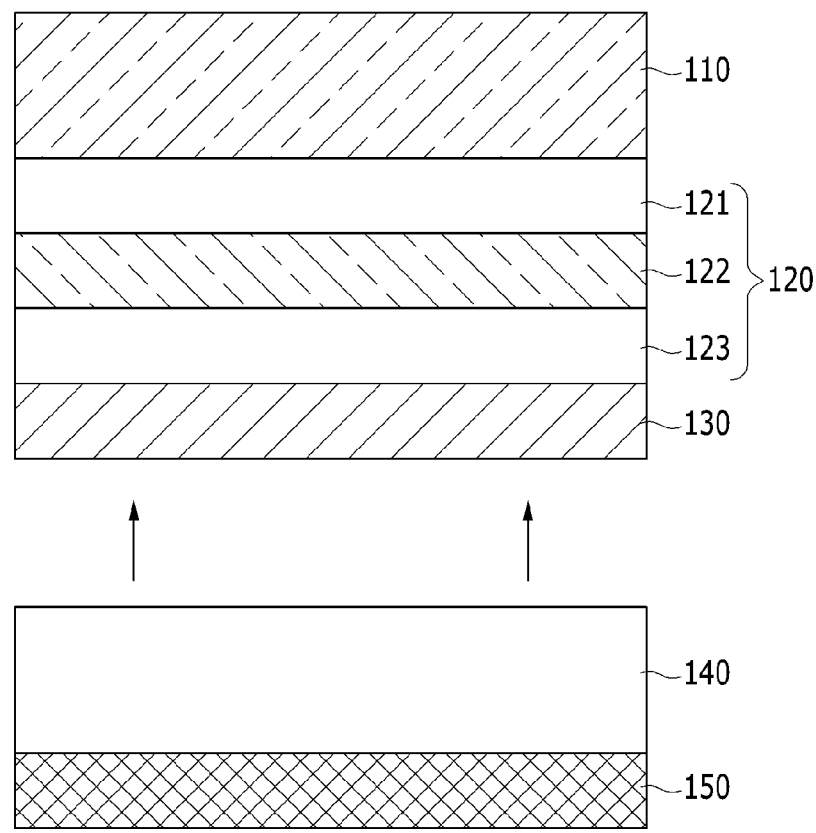

FIG. 6 to FIG. 8 are views sequentially showing a manufacturing method of a flexible display device according to an embodiment of the present invention.

Firstly, referring to FIG. 6, in the manufacturing method of the flexible display device according an embodiment of the present invention, the first insulation layer 130 may be formed on the supporting substrate 160. The supporting substrate 160 as a substrate supporting the display panel while forming the display panel of the flexible display device is removed after the display panel is completed.

Next, the display panel 120 is formed on the first insulation layer 130. In detail, the display substrate 123 is formed on the first insulation layer 130, and then the organic light emitting element 122 and the thin film encapsulation layer 121 are sequentially deposited. The process of forming the display substrate 123, the organic light emitting element 122, and the thin film encapsulation layer 121 on the first insulation layer 130 is applied with a disclosed display panel such that a detailed description thereof is omitted.

Next, referring to FIG. 7, the supporting substrate 160 is separated from the first insulation layer 130. At this time, the process of separating the supporting substrate 160 from the first insulation layer 130 may be applied with a process of separating a supporting substrate from the display panel in the manufacturing process of the flexible display device.

Next, referring to FIG. 8, the reinforcement layer 150 is formed on or under the lower protection film 140 attached under the display panel 120. However, sequences of the process of forming the reinforcement layer 150 on or under the lower protection film 140 and the process of separating the supporting substrate 160 from the first insulation layer 130 may be exchanged.

Next, still referring to FIG. 8, the lower protection film 140 is adhered under the first insulation layer 130. According to an embodiment of the present invention, when the reinforcement layer 150 is formed under the lower protection film 140, an upper surface of the lower protection film 140 is adhered to a lower surface of the first insulation layer 130.

After forming the display panel 120 on the first insulation layer 130, the polarizing plate 110 may be adhered on the display panel 120, and after adhering the lower protection film 140 under the first insulation layer 130, the polarizing plate 110 may be adhered on the display panel 120.

According to the manufacturing method of the flexible display device according to an embodiment of the present invention, the first insulation layer 330 may be firstly formed on a supporting substrate (not shown). This relates to the manufacturing process of the flexible display device according to the embodiment described above.

Next, the display panel 320 is formed on the first insulation layer 330. In detail, a display substrate 323 is formed on the first insulation layer 330 and then an organic light emitting element 322 and a thin film encapsulation layer 321 are sequentially deposited.

Next, a second insulation layer 360 is formed on the display panel 320. Next, the reinforcement layer 350 is formed on the second insulation layer 360.

Then, after the supporting substrate is separated from the display panel 320, a lower protection film 340 is attached under the display panel 320.

In the flexible display device according to an embodiment of the present invention, the reinforcement layer is formed on or under the display panel such that damage to the display panel due to bending stress may be prevented when the display device is bent.

Also, a manufacturing method of the flexible display device according to another embodiment of the present invention may manufacture the flexible display device in which damage to the display panel by bending stress generated in the display device is prevented.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device comprising:
   a display panel including a display substrate, an organic light emitting element formed on the display substrate, and a thin film encapsulation layer covering the organic light emitting element;
   a first insulation layer formed under the display panel;
   a lower protection film formed under the first insulation layer; and
   a reinforcement layer formed under the lower protection film, between the lower protection film and the first insulation layer, or on the display panel,
   wherein the reinforcement layer is configured to prevent damage to the display panel due to bending stress and comprises an oxide semiconductor and a metal.

2. The flexible display device of claim 1, wherein the reinforcement layer is made of an oxide semiconductor.

3. The flexible display device of claim 1, wherein the metal is one of copper, ITO, and aluminum.

4. The flexible display device of claim 2, wherein the oxide semiconductor is made of at least one of an oxide based on zinc, gallium, tin, or indium, or as a complex oxide thereof, including zinc oxide, indium-gallium-zinc oxide, indium-zinc oxide, or zinc-tin oxide.

5. The flexible display device of claim 1, wherein the reinforcement layer includes a plurality of layers.

6. The flexible display device of claim 1, wherein the reinforcement layer is formed on the display panel, and wherein the device further includes
   a second insulation layer formed between the display panel and the reinforcement layer.

7. A method of manufacturing the flexible display device of claim 1, the method comprising:
   forming the first insulation layer on a supporting substrate;
   forming the display panel including the display substrate positioned on the first insulation layer, the organic light emitting element formed on the display substrate, and the thin film encapsulation layer covering the organic light emitting element;
   separating the supporting substrate from the first insulation layer;
   forming the reinforcement layer on or under the lower protection film positioned under the display panel; and
   adhering the lower protection film under the first insulation layer,
   wherein the reinforcement layer is configured to prevent damage to the display panel due to bending stress.

8. The method of claim 7, wherein the reinforcement layer is made of an oxide semiconductor.

9. The method of claim 8, wherein the oxide semiconductor is made of one of an oxide based on zinc, gallium, tin, or indium, as a complex oxide thereof, including zinc oxide, indium-gallium-zinc oxide, indium-zinc oxide, or zinc-tin oxide.

10. A method of manufacturing the flexible display device of claim 1, the method comprising:
    forming the first insulation layer on a supporting substrate;
    forming the display panel including the display substrate positioned on the first insulation layer, the organic light emitting element formed on the display substrate, and the thin film encapsulation layer covering the organic light emitting element;
    forming a second insulation layer on the display panel;
    forming the reinforcement layer on the second insulation layer;
    separating the supporting substrate from the display panel; and
    adhering the lower protection film under the display panel,
    wherein the reinforcement layer prevents damage to the display panel due to bending stress.

11. The method of claim 10, wherein the reinforcement layer is made of an oxide semiconductor.

12. The method of claim 11, wherein the oxide semiconductor is made of one of an oxide based on zinc, gallium, tin, or indium, or as a complex oxide thereof, including zinc oxide, indium-gallium-zinc oxide, indium-zinc oxide, or zinc-tin oxide.

* * * * *